US012772838B2

United States Patent
(12) United States Patent
Crecelius et al.

(10) Patent No.: US 12,772,838 B2
(45) Date of Patent: Oct. 20, 2026

(54) METHOD FOR FORMING A HEAT-SINKED POWER SEMICONDUCTOR

(71) Applicant: AMERICAN AXLE & MANUFACTURING, INC., Detroit, MI (US)

(72) Inventors: David Crecelius, Cicero, IN (US); Charles G. Stuart, Rochester Hills, MI (US); Cory J. Padfield, Royal Oak, MI (US)

(73) Assignee: AMERICAN AXLE & MANUFACTURING, INC., Detroit, MI (US)

( * ) Notice: Subject to any disclaimer, the term of this patent is extended or adjusted under 35 U.S.C. 154(b) by 1051 days.

(21) Appl. No.: 17/895,523

(22) Filed: Aug. 25, 2022

(65) Prior Publication Data

US 2026/0190987 A1 Jul. 2, 2026

Related U.S. Application Data

(63) Continuation of application No. PCT/US2022/026127, filed on Apr. 25, 2022.

(Continued)

(51) Int. Cl.
*H01L 21/00* (2006.01)
*H10W 40/00* (2026.01)

(Continued)

(52) U.S. Cl.
CPC ....... *H10W 40/037* (2026.01); *H10W 40/228* (2026.01); *H10W 40/235* (2026.01); *H10W 40/242* (2026.01); *H10W 90/756* (2026.01)

(58) Field of Classification Search
CPC ............. H10W 40/037; H10W 40/235; H10W 40/242; H10W 40/228; H10W 90/756;

(Continued)

(56) References Cited

U.S. PATENT DOCUMENTS

| | | | |
|---|---|---|---|
| 6,081,027 | A | 6/2000 | Akram |
| 6,404,065 | B1 | 6/2002 | Choi |

(Continued)

FOREIGN PATENT DOCUMENTS

| | | | |
|---|---|---|---|
| CN | 2541230 | Y | 3/2003 |
| CN | 103496320 | | 1/2014 |

(Continued)

OTHER PUBLICATIONS

PCT International Search Report and Written Opinion dated Aug. 23, 2022 for corresponding PCT application No. PCT/US2022/026127, filed Apr. 25, 2022.

(Continued)

*Primary Examiner* — Niki H Nguyen
(74) *Attorney, Agent, or Firm* — DICKINSON WRIGHT PLLC

(57) ABSTRACT

A method for forming a heat-sinked power semiconductor. The method includes: providing a power semiconductor having a power semiconductor die, a plurality of pin terminals and a plate terminal, the power semiconductor die having a plurality of semiconductor terminals, each of the pin terminals being electrically coupled to a corresponding one of the semiconductor terminals, the plate terminal being electrically coupled to one of the pin terminals, the plate terminal having an exterior surface that is covered with at least one sinter-resistant material; removing the at least one sinter-resistant material from the plate terminal to expose the exterior surface; heating a heat sink to a predetermined temperature; and sintering the heat sink to the exterior surface of the plate terminal.

15 Claims, 2 Drawing Sheets

Related U.S. Application Data

(60) Provisional application No. 63/209,588, filed on Jun. 11, 2021.

(51) Int. Cl.
*H10W 40/20* (2026.01)
*H10W 40/22* (2026.01)
*H10W 90/00* (2026.01)

(58) Field of Classification Search
CPC ..... H10W 40/47; H10W 72/30; H10W 74/00; H10W 90/00; H10W 40/10; H10W 40/255; H10W 70/461; H10W 70/481; H10W 72/071; H10W 72/07336; H10W 72/07636; H10W 72/07653; H10W 72/5363; H10W 72/5449; H10W 72/5524; H10W 72/652; H10W 72/871; H10W 76/47; H10W 90/701; H10W 90/753; H10W 90/764
See application file for complete search history.

(56) References Cited

U.S. PATENT DOCUMENTS

| | | | | |
|---|---|---|---|---|
| 6,820,707 | B1 | 11/2004 | Cantemir | |
| 6,978,853 | B2 | 12/2005 | Bennett | |
| 7,610,979 | B1 | 11/2009 | Dykowski et al. | |
| 7,863,098 | B2 | 1/2011 | Lange et al. | |
| 8,933,484 | B2 | 1/2015 | Imai et al. | |
| 9,527,382 | B2 | 12/2016 | Smetana | |
| 9,625,021 | B2 | 4/2017 | Knoblauch et al. | |
| 10,036,458 | B2 | 7/2018 | Littlefield et al. | |
| 11,338,660 | B2 | 5/2022 | Laforce et al. | |
| 2001/0050422 | A1 * | 12/2001 | Kishimoto ............ | H10W 72/30 438/106 |
| 2005/0104027 | A1 | 5/2005 | Lazarev | |
| 2006/0056213 | A1 * | 3/2006 | Lee ..................... | H10W 90/811 257/E25.031 |
| 2008/0128896 | A1 | 6/2008 | Toh et al. | |
| 2013/0001002 | A1 | 1/2013 | Platt et al. | |
| 2017/0085228 | A1 | 3/2017 | Abdo et al. | |
| 2017/0331356 | A1 | 11/2017 | Nakashima | |
| 2018/0297401 | A1 | 10/2018 | Liu et al. | |
| 2018/0345786 | A1 | 12/2018 | Kucharski | |
| 2019/0081537 | A1 | 3/2019 | Kiyokami et al. | |
| 2019/0287943 | A1 * | 9/2019 | Wang .................... | H10W 70/09 |
| 2019/0342988 | A1 * | 11/2019 | Viswanathan ....... | H05K 1/0206 |
| 2021/0057313 | A1 | 2/2021 | Choi | |
| 2021/0066157 | A1 | 3/2021 | Manninen et al. | |
| 2022/0037241 | A1 | 2/2022 | Downs et al. | |
| 2022/0037954 | A1 | 2/2022 | Downs | |

FOREIGN PATENT DOCUMENTS

| | | | |
|---|---|---|---|
| CN | 108599470 | | 9/2018 |
| JP | H09129791 | | 5/1997 |
| JP | 2001060750 | | 3/2001 |
| JP | 2008184111 | | 8/2008 |
| JP | 2012074440 | | 4/2012 |
| JP | 2016144382 | | 8/2016 |
| KR | 100685253 | B1 | 2/2007 |
| KR | 1020140057032 | | 5/2014 |
| KR | 1020200145091 | A | 12/2020 |
| WO | WO1996019827 | | 6/1996 |
| WO | WO2018030343 | | 2/2018 |
| WO | WO2018138530 | | 8/2018 |
| WO | WO2020219955 | | 10/2020 |

OTHER PUBLICATIONS

PCT International Search Report and Written Opinion dated Jun. 22, 2022 for corresponding PCT application No. PCT/US2022/020286, filed Mar. 15, 2022.

* cited by examiner

METHOD FOR FORMING A HEAT-SINKED POWER SEMICONDUCTOR

CROSS-REFERENCE TO RELATED APPLICATIONS

This application is a bypass continuation of International Patent Application No. PCT/US2022/026127 filed Apr. 25, 2022, which claims the benefit of U.S. Provisional Patent Application No. 63/209,588 filed Jun. 11, 2021. Each of the above-referenced applications is incorporated by reference as if fully set forth in detail herein.

STATEMENT REGARDING FEDERALLY SPONSORED RESEARCH

This invention was made with government support under Assistance Agreement DE-EE0009191 awarded by the U.S. Department of Energy. The government has certain rights to the invention.

FIELD

The present disclosure relates to a method for forming a heat-sinked power semiconductor.

BACKGROUND

This section provides background information related to the present disclosure which is not necessarily prior art.

Modern vehicle electric drive units employ an inverter for controlling the supply of electrical power to the windings of a multi-phase alternating current electric motor. The inverter includes many power semiconductors that are employed to convert high-voltage direct current electrical power into alternating current electric power that is appropriately phased to more efficiently operate the electric motor. A significant amount of heat can be generated by the power semiconductors during the operation of the vehicle electric drive unit. It is known from International Patent (PCT) Publication No. WO 2020/219955 to form an inverter with heat-sinked power semiconductors, in which a heat sink is soldered to the conductive (back) terminal of the power semiconductor, and to employ liquid cooling through the inverter so that heat is rejected from the power semiconductors into the heat sinks, and from the heat sinks directly to the liquid coolant that flows through the inverter.

While this approach has proven to be satisfactory for its intended purpose, it would nevertheless be desirable to provide a heat-sinked power semiconductor having a conductive (back) terminal-to-heat sink connection that was relatively more tolerant of heat than the aforementioned solder connection. It would also be desirable if the heat-sinked power semiconductor were to be formed using a commercially-available (i.e., "off the shelf") power semiconductor.

SUMMARY

This section provides a general summary of the disclosure, and is not a comprehensive disclosure of its full scope or all of its features.

In one form, the present disclosure provides a method for forming a heat-sinked power semiconductor. The method includes: providing a power semiconductor having a power semiconductor die, a plurality of pin terminals and a plate terminal, the power semiconductor die having a plurality of semiconductor terminals, each of the pin terminals being electrically coupled to a corresponding one of the semiconductor terminals, the plate terminal being electrically coupled to one of the pin terminals, the plate terminal having an exterior surface that is covered with at least one sinter-resistant material; removing the at least one sinter-resistant material from the plate terminal to expose the exterior surface; heating a heat sink to a predetermined temperature; and sintering the heat sink to the exterior surface of the plate terminal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
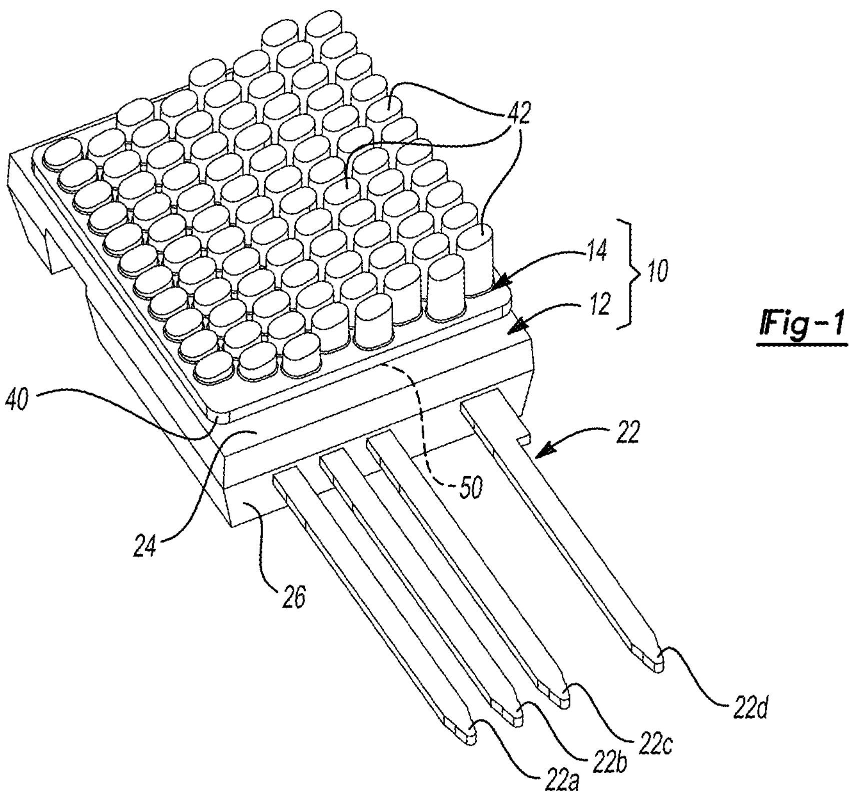
FIG. 1 is a rear perspective view of an exemplary heat-sinked power semiconductor that is formed in accordance with the teachings of the present disclosure.
Figure 2:
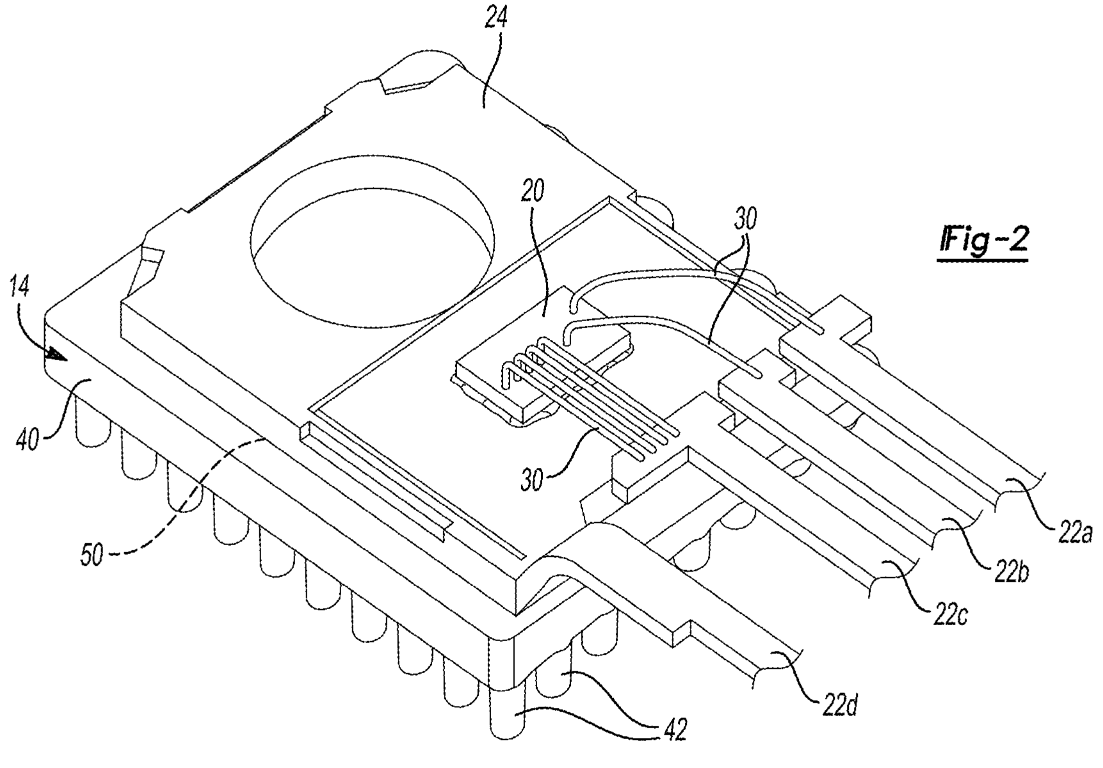
FIG. 2 is a front perspective view of a portion of the heat-sinked power semiconductor of FIG. 1, the view depicting a power semiconductor without an encapsulant body for clarity.

With reference to FIGS. 1 and 2 of the drawings, a heat-sinked power semiconductor constructed in accordance with the teachings of the present disclosure is generally indicated by reference numeral 10. The heat-sinked power semiconductor 10 can include a power semiconductor 12 and heat sink 14.

The power semiconductor 12 can be any type of power semiconductor, such as a transistor. For example, the power semiconductor 12 could be an Integrated-Gate Bipolar Transistor (IGBT), but in the particular example provided is a Metal Oxide Silicon Field Effect Transistor (MOSFET). The power semiconductor 12 can include a semiconductor die 20, a plurality of pin terminals 22, a plate terminal 24, and an encapsulant body 26. The semiconductor die 20 can have a plurality of semiconductor terminals (not specifically shown) that are each electrically coupled to an associated one of the pin terminals 22. In the example provided, the semiconductor die 20 has four semiconductor terminals that comprise a gate (not specifically shown), a source sense (not specifically shown), a source (not specifically shown), and a drain (not specifically shown). Each of the pin terminals 22 is formed of an electrically conductive metal material, such as copper, and can be electrically coupled to an associated one of the semiconductor terminals. For example, each of the pin terminals 22 can be bonded to an associated one of the semiconductor terminals with a solder material to thereby electrically and physically couple the pin terminal 22 to the associated one of the semiconductor terminals. Alternatively, one or more bond wires 30 could be employed to electrically couple one of the pin terminals 22 to an associated one of the semiconductor terminals. The plate terminal 24 can be electrically coupled to one of the pin terminals 22 and could be directly mounted to one of the semiconductor terminals. In the example provided, the pin terminal 22*a* is electrically coupled to the gate, the pin terminal 22*b* is electrically coupled to the source sense, the pin terminal 22*c* is electrically coupled to the source, and the pin terminal 22*d* is electrically coupled to both the drain and the plate terminal 24. The plate terminal 24 is formed of a suitable electrically conductive metal material, such as copper. The encapsulant body 26 is formed of an encapsulant material that is disposed over the semiconductor die 20. The semiconductor die 20 and the bond wires 30 are fully encapsulated in the encapsulant material, and the pin terminals 22 are partly encapsulated in the encapsulant material. Optionally, the plate terminal 24 can be partly encapsulated in the encapsulant material.

The heat sink 14 can have a heat sink base 40 and a plurality of fins 42 that are fixedly coupled to and project outwardly from the heat sink base 40. The heat sink base 40 can be formed of an appropriate material, such as copper. The fins 42 can be shaped and spaced in any desired manner. In the particular example provided, each of the fins 42 has a tapered rod-like configuration, with an oval cross-sectional shape that is relatively larger where proximal ends of the fins 42 abut the heat sink base 40, and relatively narrower opposite or distal end. Moreover, the distal ends of the fins 42 are slanted so as to lie in a plane that is not perpendicular to the longitudinal axes of the fins 42. As such, the fins 42 are not uniform in their height in the example provided. If desired, the heat sink 14 can be integrally and unitarily formed in a desired manner, such as investment casting, cold forging or metal injection molding (MIM). Alternatively, the heat sink base 40 and the fins 42 could be formed as discrete components and can be assembled together such that the fins 42 are fixedly coupled to the heat sink base 40.

An appropriate sinter material 50, such as a silver sinter material or a copper sinter material, is employed to fixedly couple the heat sink 14 to the plate terminal 24. The sinter material 50 is disposed between the heat sink base 40 and the plate terminal 24.

Figure 3:
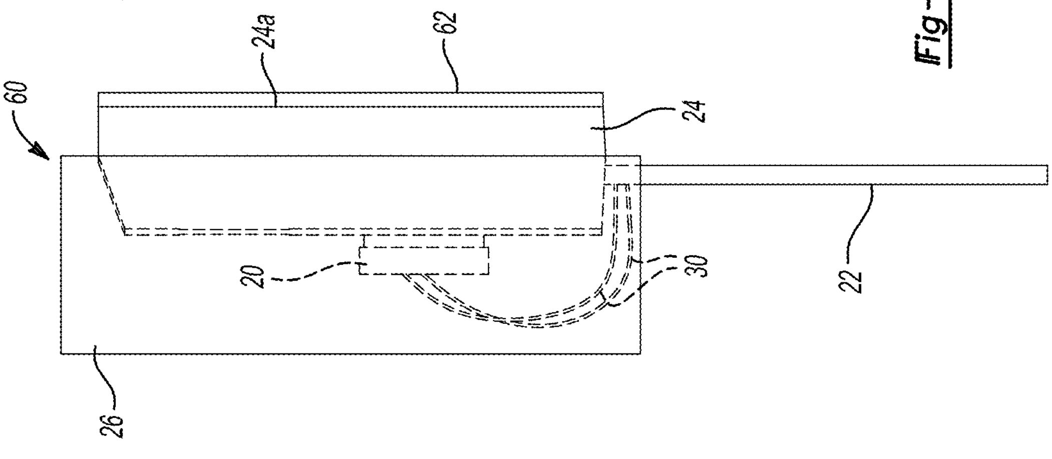
FIG. 3 is a side elevation view of a conventional, commercially-available power semiconductor.

With reference to FIG. 3, an exemplary method for forming the heat-sinked power semiconductor 10 (FIG. 1) will be described. The method includes providing a conventional, commercially available power semiconductor 60. The conventional, commercially available power semiconductor 60 is generally similar to the power semiconductor 12 (FIG. 1) except that at least one sinter-resistant layer is applied to or formed on the outer surface 24*a* of the plate terminal 24. Each sinter-resistant layer 62 is distinct from the plate terminal 24 and can comprise an oxidized metal, such as an oxidized form of a metal (i.e., a metal other than that which forms the plate terminal 24), and/or one or more layers of plating, such as tin plating and/or nickel plating. It is common practice for the conventional, commercially available power semiconductor 60 to be electrically and/or mechanically coupled to another component via a solder connection. The sinter-resistant layer(s) 62, especially when they include a top layer of tin or nickel plating, typically do not impede the wetting and bonding that are needed for the formation of a solder joint.

Figure 4:
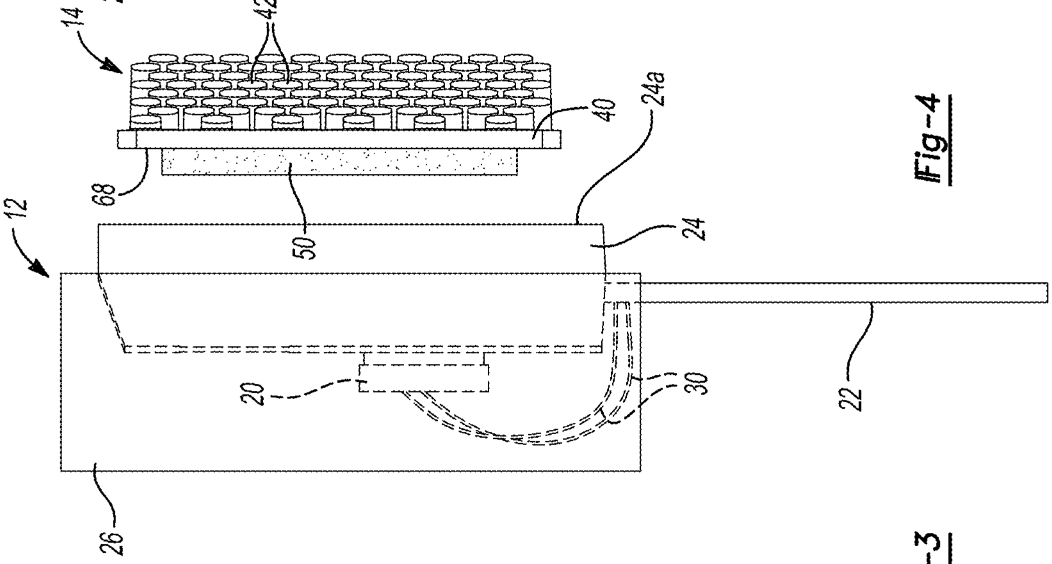
FIG. 4 is a side elevation view illustrating the components of the heat-sinked power semiconductor prior to the sintering of a heat sink to the power semiconductor.

With reference to FIGS. 3 and 4, all of the sinter-resistant layers 62, and optionally oxidization on the plate terminal 24 if such oxidization is present, are removed from the conventional, commercially available power semiconductor 60 to form the power semiconductor 12. Removal of the sinter-resistant layer(s) 62 and if desired, oxidization on the plate terminal 24, may be performed by any suitable process, such as an abrasive process (e.g., grinding, sanding), exposure to a chemical solution (e.g., an acid), a metal cutting process (e.g., milling), or ablation (e.g., ion beam ablation, laser beam ablation, electro-ablation).

Optionally, the heat sink 14 could undergo suitable processing to remove oxidization and/or oil from the exterior surface 68 of the heat sink base 40.

The sinter material 50 is applied to the exterior surface 68 of the heat sink base 40. The sinter material 50 can be in any desired form, such as a paste. The heat sink 14 and the sinter material 50 can be heated to a first predetermined temperature for a first predetermined time to drive off volatile compounds in the sinter material 50. Optionally, the heat sink 14 and the sinter material 50 can be heated in a vacuum or in an atmosphere that is formed of one or more inert gases.

Figure 5:
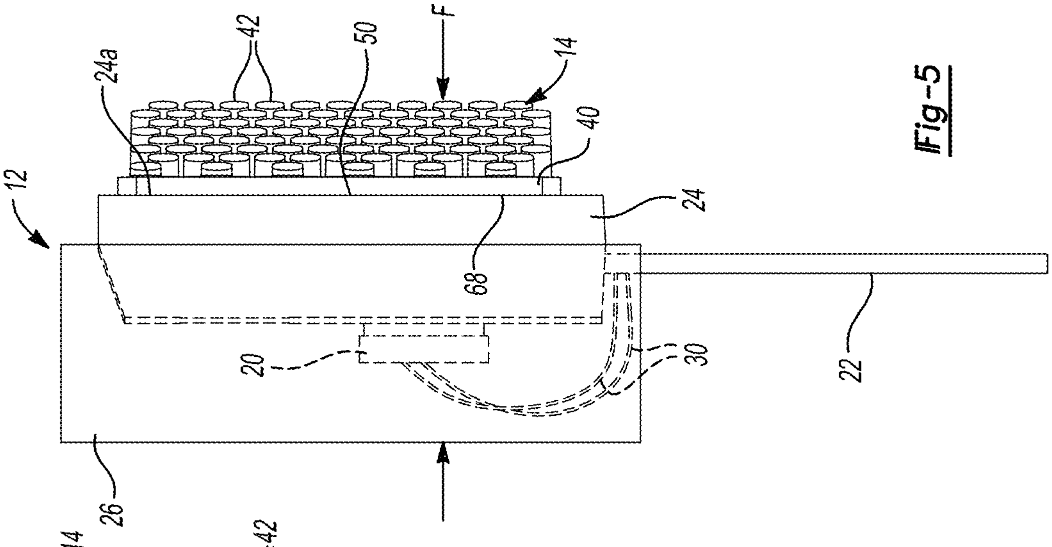
FIG. 5 is a side elevation view illustrating the components of the heat-sinked power semiconductor shown in FIG. 4 while the heat sink and the power semiconductor are being sintered together.

With reference to FIGS. 4 and 5, the power semiconductor 12 is next assembled to the heated heat sink 14 such that the sinter material 50 is disposed between the exterior surface 68 of the heat sink base 40 and the outer surface 24*a* of the plate terminal 24. A compressive force F is applied to the assembly of the power semiconductor 12, the sinter material 50 and the heat sink 14. Those of skill in the art will appreciate that the compressive force F is applied over an area of contact between the exterior surface 68 of the heat sink base 40, the sinter material 50 and the outer surface 24*a* of the plate terminal 24 and as such, the compressive force F can be controlled as a function of pressure (i.e., the compressive force F being equal to an applied pressure divided by the area of contact). It will be appreciated that a fixture (not specifically shown) can be employed to both hold the power semiconductor 12 and the heat sink 14, as well as to apply the compressive force. In one relative simple form, the fixture includes a pair of steel plates, which abut the fins 42 of the heat sink 14 and the encapsulant body 26 of the power semiconductor 12, and a plurality of threaded fasteners that secure the steel plates to one another. The threaded fasteners are tightened to produce a clamping force (i.e., the compressive force). It will be appreciated, too, that the portion of the fixture that abuts the fins 42 of the heat sink 14 can be heated to the predetermined first temperature with the heat sink 14 and the sinter material 50. In a relatively more sophisticated form, a controllable device, such as a servo press, can be employed to exert the compressive force onto the two plate-like components of the fixture that abut the fins 42 and the power semiconductor 12. The controllable device can have a movable ram and optionally, the controllable device can record a location of the ram and/or the force of the ram to permit the monitoring of the dimensions of the heat-sinked power semiconductor 10 and/or the pressure that is applied over the interface (i.e., area of contact) between the heat sink 14, the sinter material 50 and the power semiconductor 12.

In one form, the residual heat in the heat sink 14 and sinter material 50, and if employed, the fixture or portion thereof, in combination with the compressive force F, are employed to cause the sinter material 50 to diffuse into the heat sink base 40 and the plate terminal 24. In another form, the assembly of the power semiconductor 12, the sinter material 50 and the heat sink 14 are heated to a second predetermined temperature while the compressive force is maintained on the assembly to aid or expedite the diffusion of the sinter material 50 into the heat sink base 40 and the plate terminal 24. Optionally, the assembly can be disposed in a vacuum or in an atmosphere that is formed of one or more inert gases while the sinter material 50 diffuses into the heat sink base 40 and the plate terminal 24.

Depending on the manner in which the compressive force F is developed, the magnitude of the compressive force may change as the assembly is heated and/or as the assembly cools. However, the magnitude of the compressive force F is preferably greater than or equal to a predetermined threshold until the compressive force F is removed at a suitable time (i.e., after the power semiconductor 12 and the heat sink 14 are sintered together).

It will be appreciated that the first predetermined temperature and the second predetermined temperature are less than the melting point of any of the plate terminal 24, heat sink 14, and the sinter material 50.

The compressive force F can be maintained on the assembly for a second predetermined amount of time to permit the sinter material 50 to diffuse into the plate terminal 24 and the heat sink base 40 to fuse the assembly together (and thereby form the heat-sinked power semiconductor 10 (FIG. 1)) as though the heat sink base 40, the sinter material 50 and the plate terminal 24 were formed as one solid piece. After the second predetermined time has elapsed, the heat-sinked power semiconductor 10 can be cooled, and thereafter the compressive force F can be removed from the heat-sinked power semiconductor 10.

It is noted that the maximum temperature to which the power semiconductor 12 may be exposed is limited by both is internal joints (e.g., the bond wires 30 to the semiconductor terminals and the pin terminals 22) and the encapsulant material that forms the encapsulant body 26. The compressive force F will also be limited by the strength of the encapsulant material that forms the encapsulant body 26. Both the internal joints and the encapsulant material can withstand brief exposure to temperatures higher than their maximum steady-state operational temperatures.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for forming a heat-sinked power semiconductor, the method comprising:

providing a power semiconductor having a power semiconductor die, a plurality of pin terminals and a plate terminal, the power semiconductor die having a plurality of semiconductor terminals, each of the pin terminals being electrically coupled to a corresponding one of the semiconductor terminals, the plate terminal being electrically coupled to one of the pin terminals, the plate terminal having an exterior surface that is covered with at least one sinter-resistant material;

removing the at least one sinter-resistant material from the plate terminal to expose the exterior surface;

heating a heat sink to a predetermined temperature; and sintering the heat sink to the exterior surface of the plate terminal.

2. The method of claim 1, further comprising applying a sinter paste to at least one of the heat sink and the exterior surface.

3. The method of claim 2, wherein the sinter paste is applied to the heat sink prior to heating the heat sink to the predetermined temperature.

4. The method of claim 1, wherein sintering the heat sink to the exterior surface of the plate terminal includes applying a compressive force that is exerted between the plate terminal of the power semiconductor and the heat sink.

5. The method of claim 4, wherein a fixture having a first fixture component is employed to apply the compressive force to the plate terminal of the power semiconductor and the heat sink, and wherein the heat sink is mounted to the first fixture component prior to the heat sink being heated to the predetermined temperature.

6. The method of claim 4, wherein the compressive force is maintained for a predetermined time.

7. The method of claim 4, wherein the compressive force is maintained until the heat sink has a temperature that is less than or equal to a predetermined temperature threshold.

8. The method of claim 1, wherein removing the at least one sinter-resistant material from the plate terminal comprises processing the power semiconductor in an abrasive process.

9. The method of claim 8, wherein the abrasive process comprises at least one of grinding and sanding.

10. The method of claim 1, wherein removing the at least one sinter-resistant material from the plate terminal comprises exposing the plate terminal to a chemical solution.

11. The method of claim 10, wherein the chemical solution is an acid.

12. The method of claim 1, wherein removing the at least one sinter-resistant material from the plate terminal comprises processing the power semiconductor in a metal cutting process.

13. The method of claim 1, wherein removing the at least one sinter-resistant material from the plate terminal comprises ablating the plate terminal.

14. The method of claim 1, wherein the sinter material comprises at least one of silver and copper.

15. The method of claim 1, wherein sintering the heat sink to the exterior surface of the plate terminal comprises applying a force to the heat sink and the power semiconductor that drives an outer surface of a heat sink base of the heat sink toward the exterior surface of the plate terminal.

* * * * *